United States Patent [19]

Katsumata et al.

[11] Patent Number: 5,428,535
[45] Date of Patent: Jun. 27, 1995

[54] VEHICLE CONTROL UNIT STRUCTURE

[75] Inventors: Ikuo Katsumata; Hideki Hashizume; Masafumi Nagami, all of Omiya, Japan

[73] Assignee: Kansei Corporation, Saitama, Japan

[21] Appl. No.: 121,586

[22] Filed: Sep. 16, 1993

[30] Foreign Application Priority Data

| Sep. 17, 1992 | [JP] | Japan | 4-247444 |
| Sep. 17, 1992 | [JP] | Japan | 4-247445 |
| Oct. 30, 1992 | [JP] | Japan | 4-293249 |

[51] Int. Cl.⁶ .................. H01R 23/70; H01R 9/09
[52] U.S. Cl. .................. 364/424.05; 364/708.1; 361/785; 361/641
[58] Field of Search ............ 364/424.05, 137, 148, 364/708; 180/315, 198; 361/614, 622, 633, 640, 728, 748, 752, 785, 791, 796, 825, 826, 395

[56] References Cited

U.S. PATENT DOCUMENTS

| 4,683,550 | 7/1987 | Jindrick et al. | 364/900 |
| 4,715,822 | 12/1987 | Stribel | 361/412 |
| 4,941,841 | 7/1990 | Darden et al. | 364/708 |
| 4,956,750 | 9/1990 | Maggelet | 361/415 |
| 5,036,481 | 7/1991 | Lunsford et al. | 364/708 |
| 5,040,097 | 8/1991 | Stribel | 361/395 |
| 5,113,316 | 5/1992 | Navarro et al. | 361/396 |
| 5,134,546 | 7/1992 | Izumi et al. | 361/395 |
| 5,243,131 | 9/1993 | Jakob et al. | 361/688 |
| 5,283,712 | 2/1994 | Michihira et al. | 361/785 |
| 5,297,000 | 3/1994 | Freige et al. | 361/692 |

Primary Examiner—Kevin J. Teska
Assistant Examiner—Tan Nguyen
Attorney, Agent, or Firm—Keck, Mahin & Cate

[57] ABSTRACT

A mother unit includes a mother board within a case. Control units control output devices, such as an air conditioning actuator, an antiskid actuator, an air bag module, or a constant speed actuator, each provided in a vehicle. The control units are freely connected to or disconnected from the mother unit. The mother unit is connected with the actuators by a wiring harness. Further, the mother unit is connected with sensors requisite for controlling the actuators by a wiring harness. A mother board of the mother unit is provided with common circuits shared by the control units.

20 Claims, 20 Drawing Sheets

5,428,535

VEHICLE CONTROL UNIT STRUCTURE

BACKGROUND OF THE INVENTION

1. Field of the Invention

This invention relates to a control apparatus for controlling output devices, such as actuators, provided in a vehicle.

2. Description of the Prior Art

A vehicle is provided with an air conditioning control unit for controlling the air conditioning of the inside of the vehicle, an antiskid control unit for preventing a wheel from sliding, an air bag control unit for automatically inflating an air bag in case of an accident, a constant speed control unit for driving the vehicle at a desired speed, and so on. The control units are each disposed in an engine room, an instrument panel, a rear parcel, and other places in the vehicle.

As shown in FIG. 19, the control units 1a, 1b, ... are connected to various sensors and actuators by means of a wiring harness 3. The control units 1a, 1b, ... control the actuators in response to the outputs of the corresponding sensors.

As mentioned above, since the control units are each disposed in different places, there is a problem in that it is troublesome to install them in the respective places. Further, there is a problem in that weight is increased by many brackets 4 by each of which each control unit is fixed.

SUMMARY OF THE INVENTION

It is therefore an object of the invention to provide a control apparatus for a vehicle by which the number of brackets is lessened and the burden of the installation of control units is lightened.

DETAILED DESCRIPTION OF THE EMBODIMENT

The embodiment of a control apparatus for a vehicle according to the invention will be hereinafter described with reference to the attached drawings.

Figure 1:
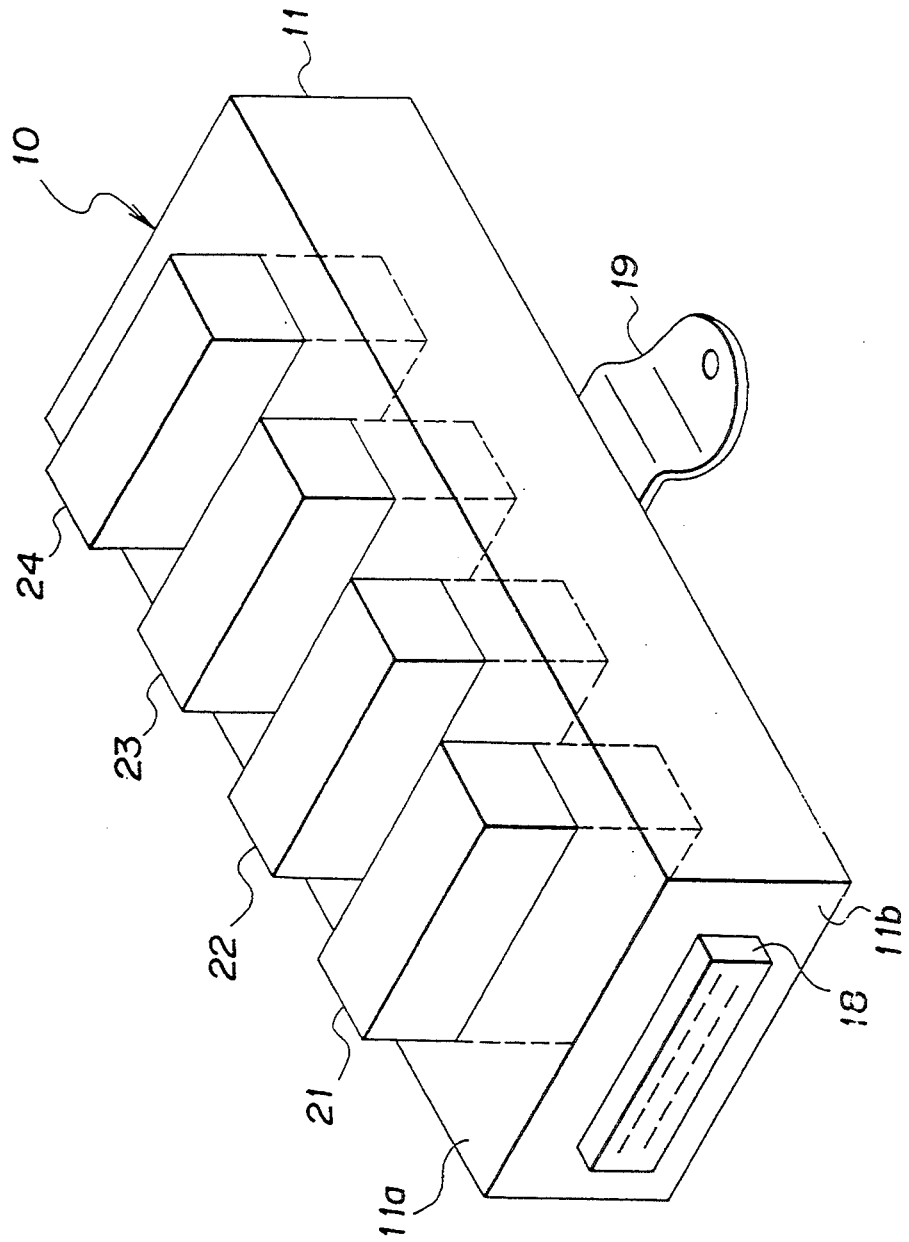
FIG. 1 is a perspective view showing a mother unit according to the invention.
Figure 2:
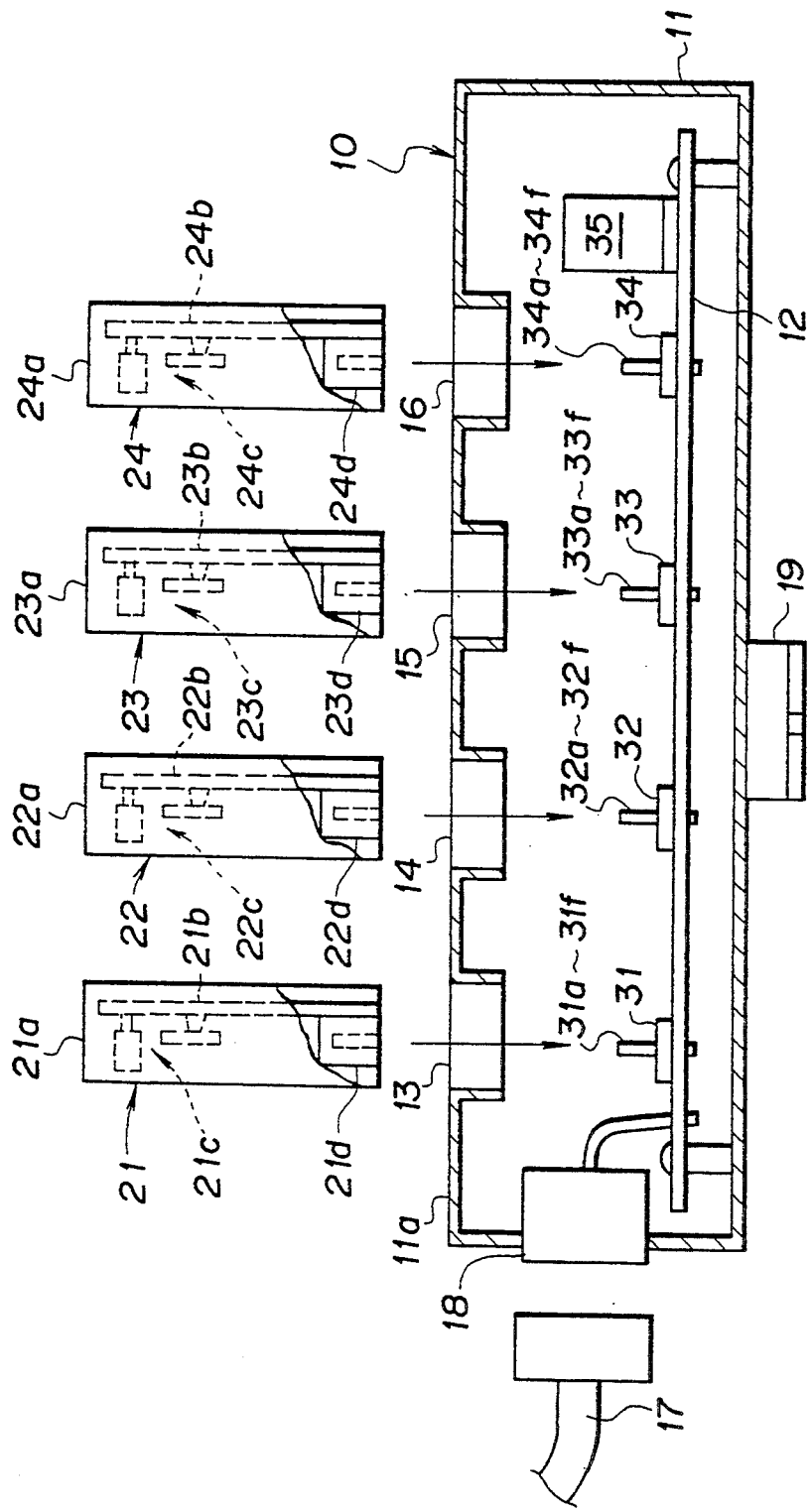
FIG. 2 is a sectional view showing the construction of the mother unit.

Referring to FIGS. 1 and 2, a mother unit 10 includes a case 11 and a mother board 12 disposed within the case 11. Through the top surface 11a of the case 11 are formed four holes 13 to 18 into which control units 21 to 24 are inserted. On the side surface 11b is disposed a connector 18 to which a harness 17 is connected. The harness 17 is connected to various actuators, not shown, instruments (output devices), or sensors. To the bottom of the case 11 is attached a bracket 19 for fastening the case 11 to the vehicle.

On the mother board 12 are disposed connectors 31 to 34 opposite to the holes 13 to 16, respectively. Connecting pins 31l–31f, 32a–32f, 33a–33f, and 34a–34f, project from the connectors 31 to 34, respectively. Further, on the mother board 12 is disposed a constant-voltage power circuit 35 for supplying electricity to the control units 21 to 24 and so forth.

Figure 3:
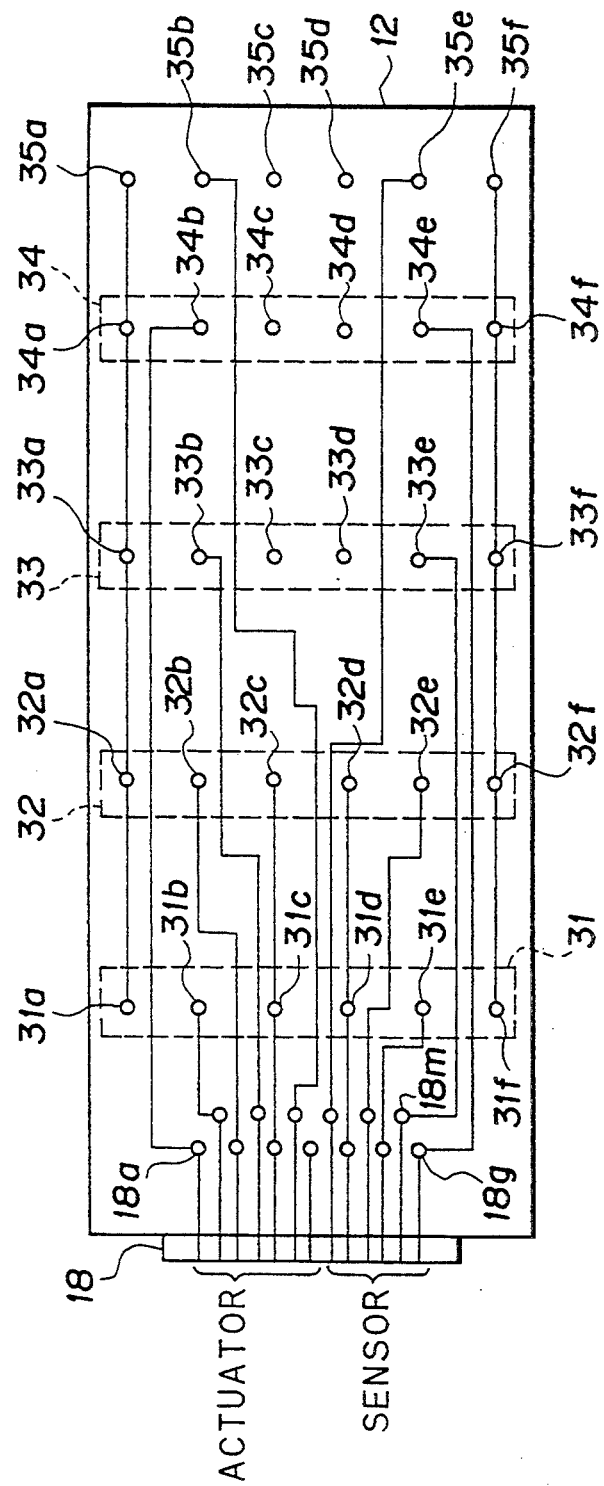
FIG. 3 is a plan view showing the undersurface of the mother unit.

As shown in FIG. 3, for example, printed wiring is formed on the under side of the mother board 12 so that the connecting pins 31a–31f, 32a–32f, 33a–334, and 34a–34f, the terminals 18a–18m of the connector 18, and the outputs 35a–35f of the power circuit 35 are electrically connected with each other.

The control unit 21 includes a substrate 21b within the case 21a. The substrate 21b is provided with an air conditioning control circuit 21c for controlling the air conditioning of the inside of the vehicle. Further, within the case 21a is included a female connector 21d which is freely connected to or disconnected from the the connecting pins 31a31f.

In order to electrically connect the control circuit 21c with an actuator for air conditioning and a sensor for air conditioning, not shown, the case 21a is first inserted into the hole 13 and then the female connector 21d is inserted into the connecting pins 31a–31f so that the control unit 21 contacts the mother board 12.

The control unit 22 includes a substrate 22b within the case 22a. The substrate 22b is provided with an antiskid control circuit 22c for stopping a skid of wheel. Further, within the case 22a is included a female connector 22d which is freely connected to or disconnected from the connecting pins 32a–32f.

In order to electrically connect the control circuit 22c with an actuator for antiskid and a sensor for antiskid, not shown, the case 22a is first inserted into the hole 14 and then the female connector 22d is inserted into the connecting pins 32a–32f so that the control unit 22 contacts the mother board 12.

The control unit 23 includes a substrate 23b within the case 23a. The substrate 23b is provided with an air bag control circuit 23c for automatically inflating an air bag in case of an accident. Further, within the case 23a is included a female connector 23d which is freely connected or disconnected from the the connecting pins 33a–33f.

In order to electrically connect the control circuit 23c with an air bag module (actuator) and a collision sensor, not shown, the case 23a is first inserted into the hole 15 and then the female connector 23d is inserted into the connecting pins 33a–33f so that the control unit 23 contacts the mother board 12.

The control unit 24 includes a substrate 24b within the case 24a. The substrate 24b is provided with a constant speed control unit 24c for driving the vehicle at a desired constant speed. Further, within the case 24a is included a female connector 24d which is freely connected to or disconnected from the connecting pins 34a–34f.

In order to electrically connect the control circuit 24c with an actuator for traveling at a constant speed and with a speed sensor, not shown, the case 24a is first inserted into the hole 18 and then the female connector 24d is inserted into the connecting pins 34a–34f so that the control unit 24 contacts the mother board 12.

As mentioned above, the control units 21 to 24 for controlling various actuators and so forth are easily connected to or disconnected from the connectors 31 to 34 disposed on the mother board 12. Further, one bracket 19 suffices to fasten the mother unit 10 to the vehicle. Therefore, the number of brackets can be lessened.

Further, since the mother unit 10 is connected with various actuators and sensors by means of the harness 17, the burden of the installation of the mother unit 10 and the harness 17 can be lightened. Further, since the individual control units 21 to 24 are provided with the corresponding control circuits 21c to 24c, respectively, an inspection of each of the control circuits 21a to 24c is easily carried out.

In the above-mentioned embodiment, a description was given of the case where the four control units 21 to 24 are brought into contact with the mother board 12, but it is not limited to this case. Of course, other control units also may be brought into contact therewith.

Figure 4:
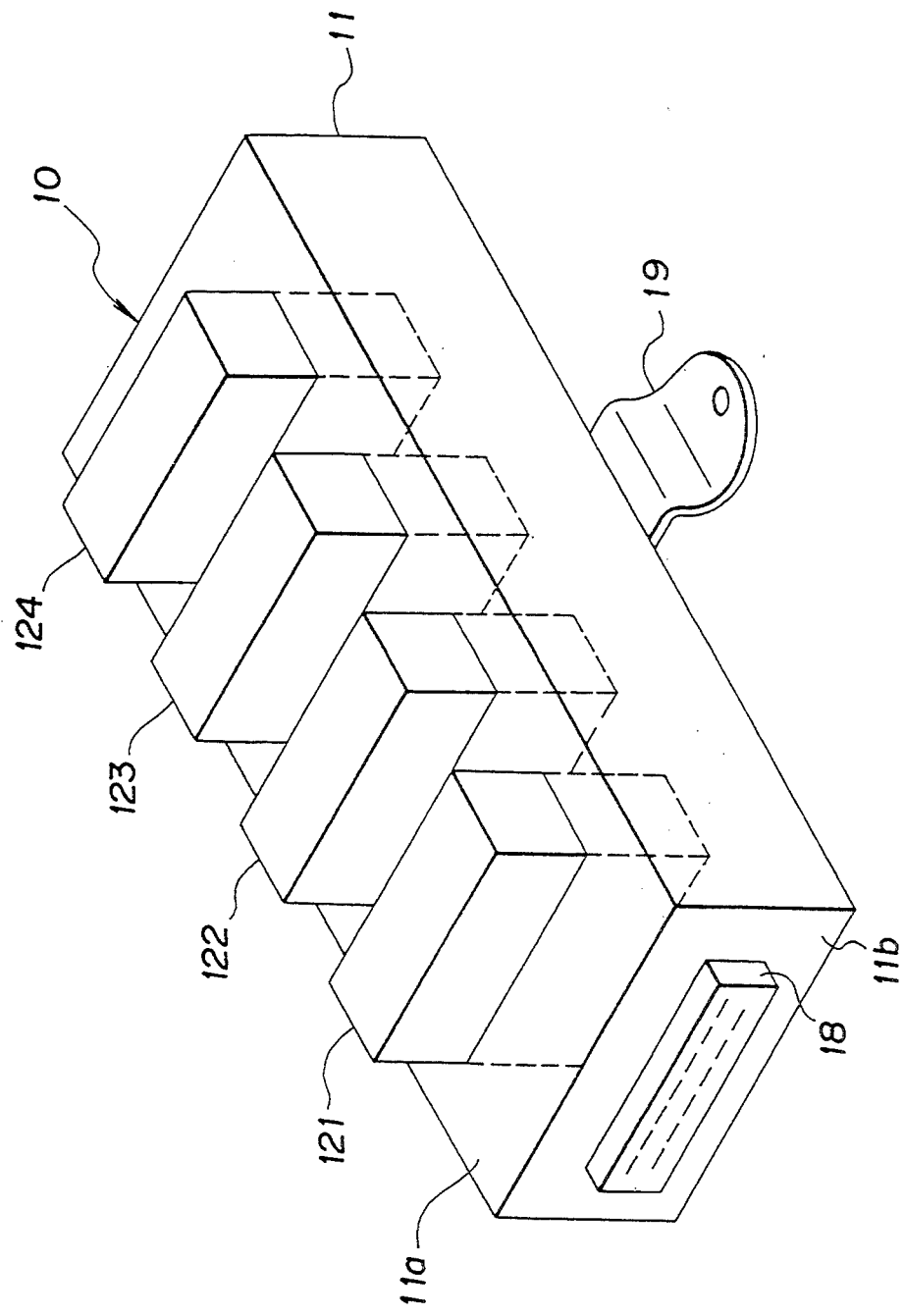
FIG. 4 is a perspective view showing a mother unit of a second embodiment of the invention.
Figure 5:
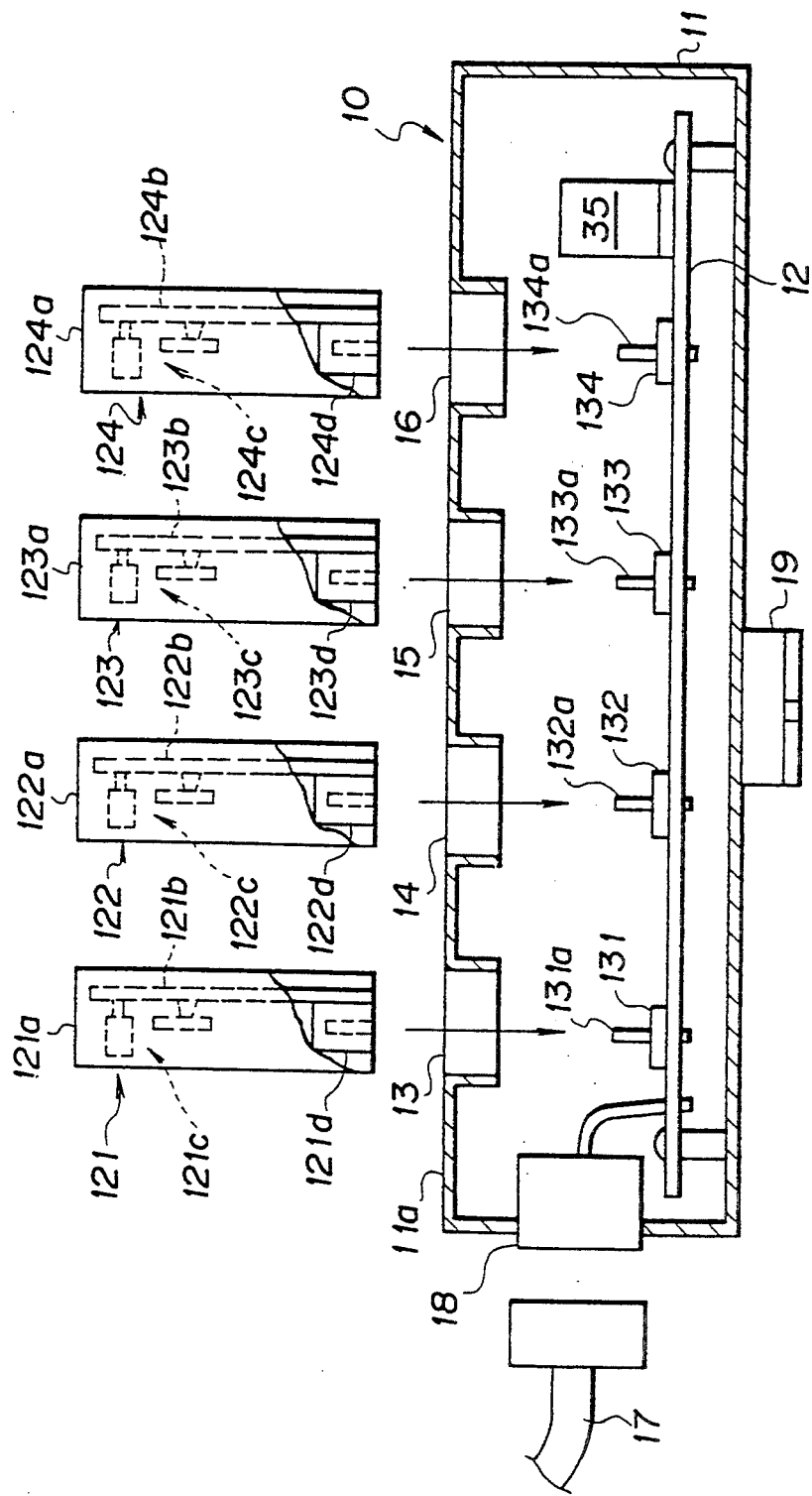
FIG. 5 is a sectional view showing the construction of the mother unit of the second embodiment.

FIGS. 4 and 5 show a second embodiment of the invention.

As shown in FIG. 5, a mother board 12 is provided with connectors 131 to 134 opposite to holes 13 to 16, respectively. Connecting pins 131a to 134a project from the connectors 131 to 134, respectively.

Figure 6:
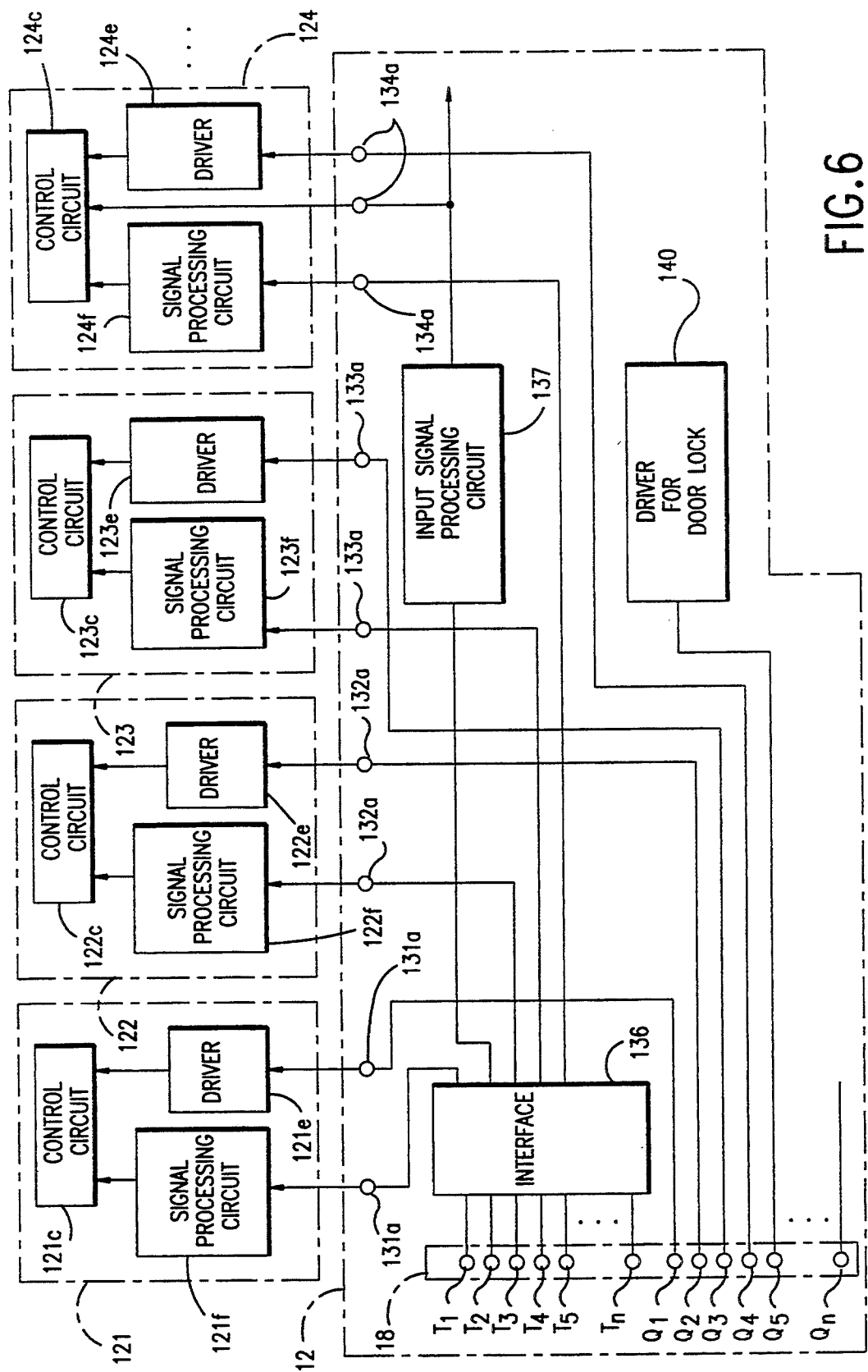
FIG. 6 is a block diagram showing a control system of a mother unit in which a mother board is provided with control units.

Further, as shown in FIG. 6, the mother board 12 is provided with an interface (input circuit) 136 for inputting sensor signals transmitted from various sensors by means of input terminals $T_1$–$T_n$ of the connector 18, an input signal processing 137 for processing speed signals transmitted from e.g., a speed sensor, not shown, a clock circuit (not shown) for outputting clock signals for the control units 121 to 124, a memory (not shown) for storing data, a door lock driver 140 which also serves as a power window driver, a fail-safe circuit (not shown) for preventing CPUs of the control units 121 to 124 from working abnormally, and so on. Output terminals $Q_1$–$Q_n$ are connected with actuators (output devices), not shown, by means of the harness 17.

The control unit 121 includes a substrate 121b within the case 121a. The substrate 121b is provided with an air conditioning control circuit 121c including a CPU for controlling the air conditioning of the inside of the vehicle, an air conditioning driver 121e for driving an actuator for air conditioning, not shown, and a signal processing circuit 121f for processing temperature signals output by a temperature sensor, not shown. Further, within the case 121a is included a female connector 121d which is freely connected to or disconnected from the connecting pins 131a–131f.

In order to electrically connect the signal processing circuit 121f with the temperature sensor by means of the interface 136 and the input terminal $T_1$, and to electrically connect the driver 121e with the actuator for air conditioning by means of the output terminal $Q_1$, the case 121a is first inserted into the hole 18 and then female connector 121d is inserted into the connecting pins 121a 131f so that the control unit 121 is brought into contact with the mother board 12. Responding to the output of the temperature sensor, the air conditioning control circuit 121c controls the output of the driver 121e.

The control unit 122 includes a substrate 122b within the case 122a. The substrate 122b is provided with an antiskid control circuit 122c including a CPU for stopping a skid of a wheel, an antiskid driver 122e for driving an actuator, not shown, for antiskid, and a signal processing circuit 122f for processing wheel-turn signals output by a wheel-turn sensor, not shown. Further, within the case 122a is included a female connector 122d which is freely connected to or disconnected from the the connecting pins 132a–132f.

In order to electrically connect the signal processing circuit 122f with the wheel-turn sensor by means of the interface 136 and the input terminal $T_3$, and to electrically connect the driver 122e with the actuator for antiskid by means of the output terminal $Q_2$, the case 122a is first inserted into the hole 14 and then the female connector 122d is inserted into the connecting pins 132a–132f so that the control unit 122 is brought into contact with the mother board 12. Responding to the output of the wheel-turn sensor, the antiskid control circuit 122c controls the output of the driver 122e.

The control unit 123 includes a substrate 123b within the case 123a. The substrate 123b is provided with an air bag control circuit 123c including a CPU for automatically inflating an air bag, not shown, in case of an accident, a driver 123e for carrying electrically to an inflator, not shown, of an air bag module (output device), not shown, and a signal processing circuit 123f for processing collision signals output by a collision sensor, not shown. Further, within the case 123a is included a female connector 123d which is freely connected to or disconnected from the the connecting pins 133a–133f.

In order to electrically connect the signal processing circuit 123f with the collision sensor by means of the interface 136 and the input terminal $T_4$, and to electrically connect the driver 123e with the inflator by means of the output terminal $Q_3$, the case 123a is first inserted into the hole 15 and then the female connector 123d is inserted into the connecting pins 133a–133f so that the control unit 123 is brought into contact with the mother board 12. Responding to the output of the collision sensor, the air bag control circuit 123c outputs a given amount of electricity from the driver 123e.

The control unit 124 includes a substrate 124b within the case 124a. The substrate 124b is provided with a constant speed control circuit 124c including a CPU for controlling the speed of the vehicle at a given speed, an acceleration driver 124e for driving an actuator, not shown, for acceleration, and a signal processing circuit 124f for processing acceleration signals output by an acceleration sensor, not shown. Further, within the case 124a is included a female connector 124d which is freely connected to or disconnected from the the connecting pins 134a–134f.

In order to electrically connect the signal processing circuit 124f with the acceleration sensor by means of the interface 136 and the input terminal $T_5$, and to electrically connected the driver 124e with the acceleration actuator by means of the output terminal $Q_4$, the case 124a is first inserted into the hole 16 and then the female connector 124d is inserted into the connecting pins 134a–134f so that the control unit 124 is brought into contact with the mother board 12. Responding to the outputs of the acceleration sensor and a speed sensor, the constant speed control circuit 124c controls the output of the driver 124e to keep the speed of the vehicle at a given speed.

The input signal processing circuit 137 is connected with the speed sensor, not shown, by means of the interface 136 and an input terminal $T_2$. Speed signals output by the speed sensor are processed by the processing circuit 137 and then are output to, for example, an automatic transmission control circuit, not shown, as well as to the constant speed control circuit 124c. This automatic transmission control circuit is provided on a substrate within a control unit case, not shown. This case is also freely connected to and disconnected from the mother board 12.

A memory (not shown) stores data concerning a predetermined temperature of the inside of the vehicle requisite for the control unit 121 and a temperature detected by the temperature sensor, data concerning a predetermined speed of the vehicle requisite for the control unit 124 and a speed detected by the speed sensor, and data requisite for other control units.

The door lock driver 140 is controlled by not only a door lock control unit, not shown, but also a window power control unit, not shown. This driver 140 is used for the door lock and the window power. The door lock and window power control units are also freely connected to or disconnected from the mother board 12 as mentioned above.

Since the mother board 12 is provided with the interface 136, the input signal processing circuit 137, the clock circuit (not shown), the memory (not shown), the door lock driver 140, the fail-safe circuit, and so forth so that the control units 121 to 124 and other units share them with each other, the construction of the circuits can be simplified. Heretofore, since those circuits were arranged for each control unit, the construction of the circuits are complicated as a whole.

Figure 7:
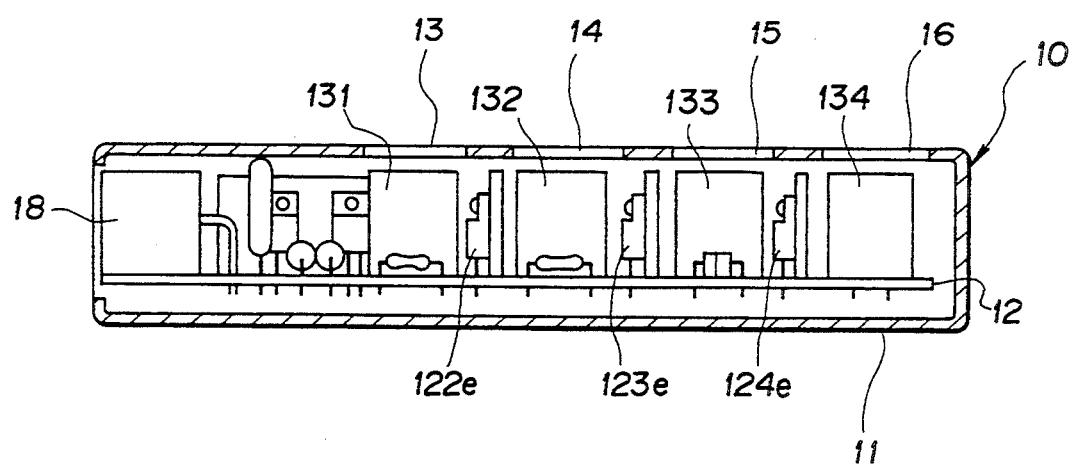
FIG. 7 is a sectional view of a mother unit in which a mother board is provided with heating elements.

Although the drivers 121e to 124e each including, e.g., a power transistor as a heating electronic element are disposed within the control units 121 to 124, respectively, the drivers 121e to 124e may be disposed on the mother board 12 as shown in FIG. 7. Also, other heating electronic elements may be disposed on the mother board 12.

Figure 8:
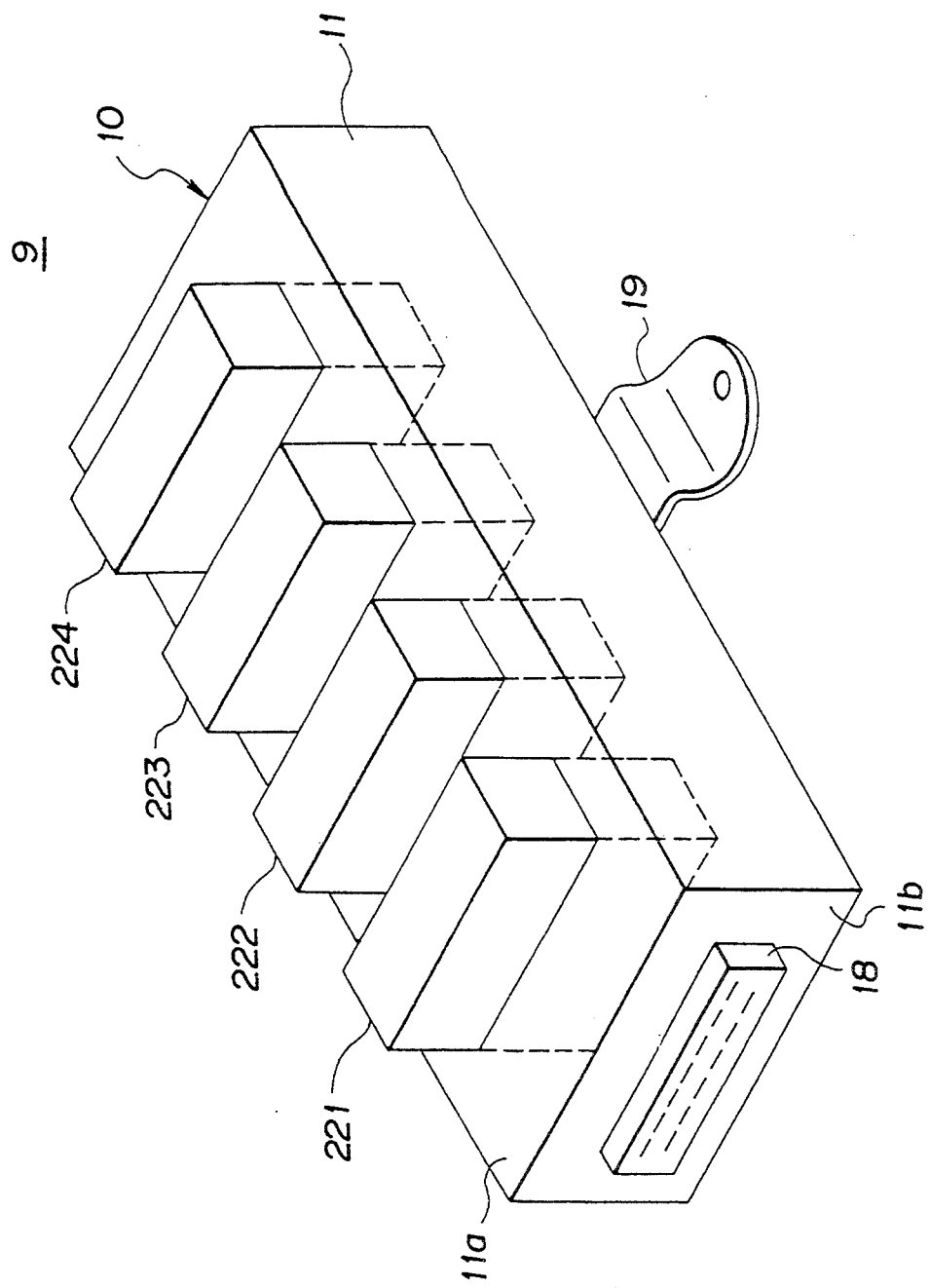
FIG. 8 is a perspective view showing a mother unit of a third embodiment of the invention.
Figure 9:
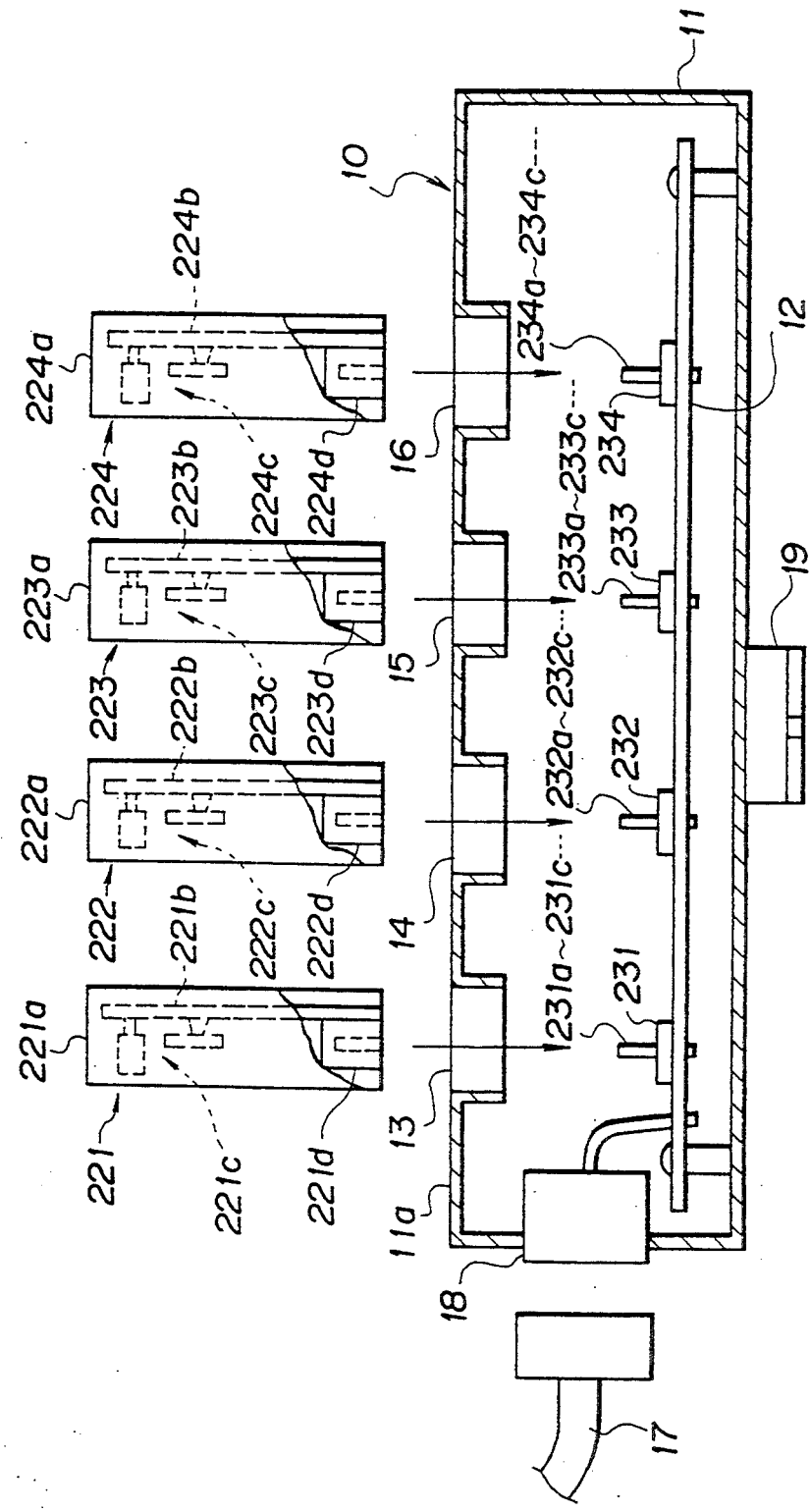
FIG. 9 is a sectional view showing the construction of the mother unit of the third embodiment.

FIGS 8 and 9 show a third embodiment of the invention.

A mother unit 10 shown in FIGS. 8 and 9 is disposed in a control portion 9 (see FIG. 11) such as an instrument panel. The control portion 9 is electrically connected with an output portion 50 by means of a harness 17.

A mother board 12 of the mother unit 10 is provided with connectors 231 to 234 opposite to holes 13 to 16, respectively. Connecting pins 231a–231c . . . to 234a–234c. . . project from the connectors 231 to 234, respectively.

Figure 10:
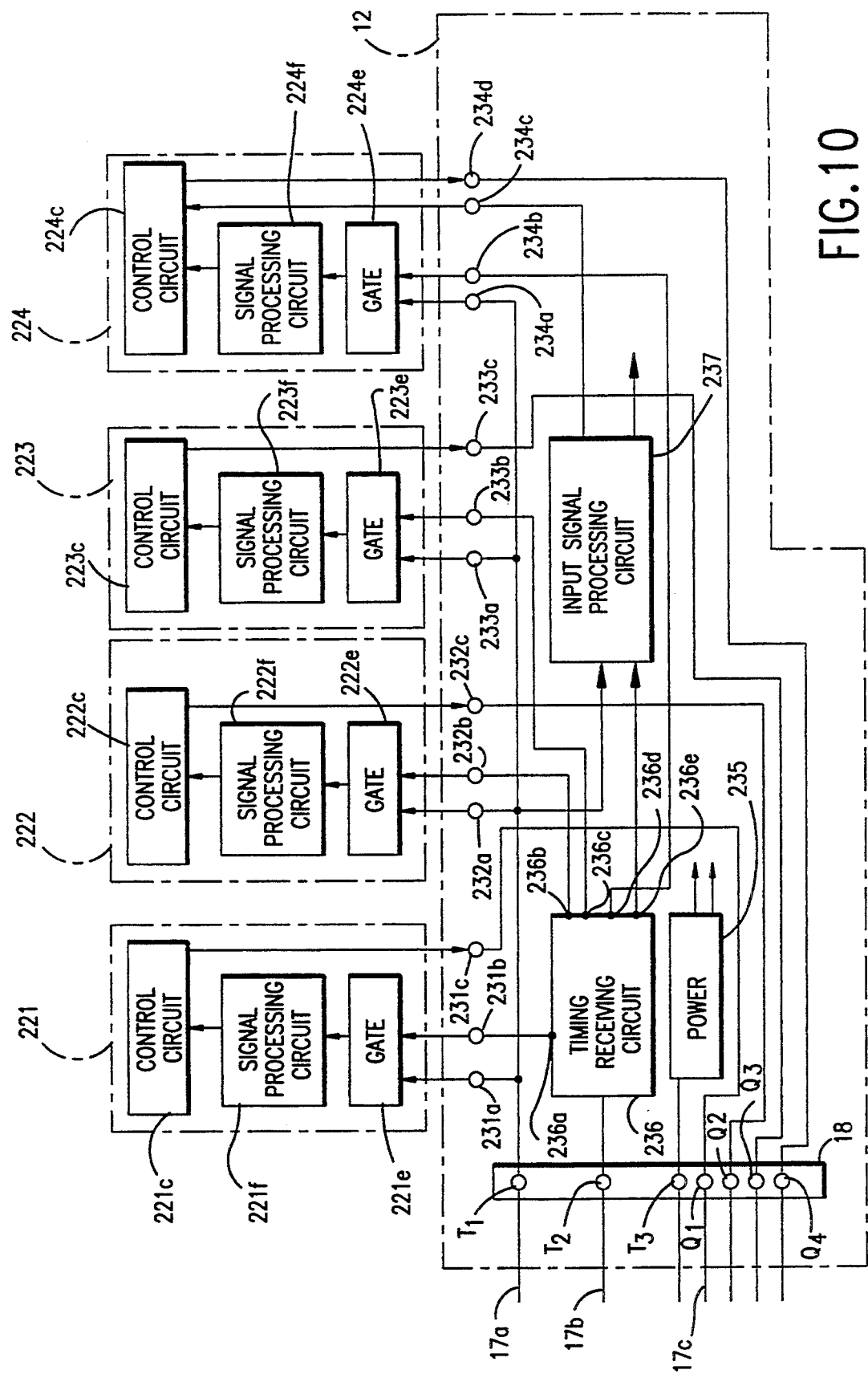
FIG. 10 is a block diagram showing a control system of a mother unit in which a mother board is provided with control units.

Further, as shown in FIG. 10, the mother board 12 is provided with a timing receiving circuit (input circuit) 236 for inputting timing signals by means of an input terminal $T_2$ of the connector 18, an input signal processing circuit 237 for processing speed signals (detection signals) $G_1$ detected by a speed sensor 55 (see FIG. 11), and so forth.

An input terminal $T_1$ of the connector 18 is connected with the connecting pins 231a, 232a, 233a, and 234a. Output terminals 236a, 236b, 236c, and 236d of the timing receiving circuit 236 are connected with the connecting pins 231b, 232b, 233b, and 234b, respectively. An output terminal 236e is connected with the input signal processing circuit 237. The timing receiving circuit 236 outputs timing signals by turns from the output terminals 236a–236e every time the timing signals are input. Output terminals $Q_1$ to $Q_4$ of the connector 18 are connected with connecting pins 231c, to 232c, 233c, and 234d.

The control unit 221 includes a substrate 221b within the case 221a. The substrate 221b is provided with an air conditioning control circuit 221c including a CPU for controlling the air conditioning of the inside of the vehicle, a gate circuit 221e, and a signal processing circuit 221f for processing signals output by the gate circuit 221e. Further, within the case 221a is included a female connector 221d which is freely connected to or disconnected from the connecting pins 231a–231c. The gate circuit 221e keeps its gate open while timing signals are output from an output terminal 236a of the timing receiving circuit 236 to input detection signals from the input terminal $T_1$ to the signal processing circuit 221f.

In order to electrically connect the signal processing circuit 221f with the input terminal $T_1$ by means of the gate circuit 221 e and the connecting pin 231a, and to electrically connect the air conditioning circuit 221c with the output terminal $Q_1$ by means of the connecting pin 231c, the case 221a is first inserted into the hole 123 and then the female connector 221d is inserted into the connecting pins 231a–231c so that the control unit 221 is brought into contact with the mother board 12.

The control unit 222 includes a substrate 222b within the case 222a. The substrate 222b is provided with an antiskid control circuit 222c including a CPU for stopping a skid of a wheel, a gate circuit 222e, and a signal processing circuit 222f for processing signals output by the gate circuit 222e. Further, within the case 222a is included a female connector 222d which is freely connected to or disconnected from the connecting pins 232a–232c. The gate circuit 222e keeps its gate open while timing signals are output from an output terminal 236b of the timing receiving circuit 236 to input detection signals from the input terminal $T_1$ to the signal processing circuit 222f.

In order to electrically connect the signal processing circuit 222f with the input terminal $T_1$ by means of the gate circuit 222e and the connecting pins 232a, and to electrically connect the antiskid control circuit 222c with the output terminal $Q_2$ by means of the connecting pins 232c, the case 222a is first inserted into the hole 14 and then the female connector 222d is inserted into the connecting pins 232a–232c so that the control unit 222 is brought into contact with the mother board 12.

The control unit 223 includes a substrate 222b within the case 223a. The substrate 223b is provided with an air bag control circuit 223c including a CPU for automatically inflating an air bag, not shown, in case of an accident, a gate circuit 223e, and a signal processing circuit 223f for processing signals output by the gate circuit 223e. Further, within the case 223a is included a female connector 223d is freely connected to or disconnected from the connecting pins 233a-233c. The gate circuit 223e keeps its gate open while timing signals are output from an output terminal 236c of the timing receiving circuit 236 to input detection signals from the input terminal $T_1$ to the signal processing circuit 223f.

In order to electrically connect the signal processing circuit 223f with the input terminal $T_1$ by means of the gate circuit 223e and the connecting pin 233a, and to electrically connect the air bag control circuit 223c with the output terminal $Q_3$ by means of the connecting pin 233c, the case 223a is first inserted into the hole 15 and then the female connector 223d is inserted into the connecting pins 233a-233c so that the control unit 223 is brought into contact with the mother board 12.

The control unit 224 includes a substrate 224b within the case 224a. The substrate 224b is provided with a constant speed control circuit 224c including a CPU for controlling the speed of the vehicle at a given speed, a gate circuit 224e, and a signal processing circuit 224f for processing signals output by the gate circuit 224e. Further, within the case 224a is included a female connector 224d which is freely connected to or disconnected from the connecting pins 234a-234d. The gate circuit 224e keeps its gate open while timing signals are output from an output terminal 236d of the timing receiving circuit 236 to input detection signals from the input terminal $T_1$ to the signal processing circuit 224f. The timing receiving circuit 236 and the gate circuits 221e, 222e, 223e, and 224e compose a receiving means.

In order to electrically connect the signal processing circuit 224f with the input terminal $T_1$ by means of the gate circuit 224e and the connecting pins 234a, and to electrically connect the constant speed control circuit 224c with the output terminal $Q_4$ by means of the connecting points 234d, the case 234e is first inserted into the hole 16 and then the female connector 224d is inserted into the connecting pins 234a-234d so that the control unit 224 is brought into contact with the mother board 12.

Figure 11:
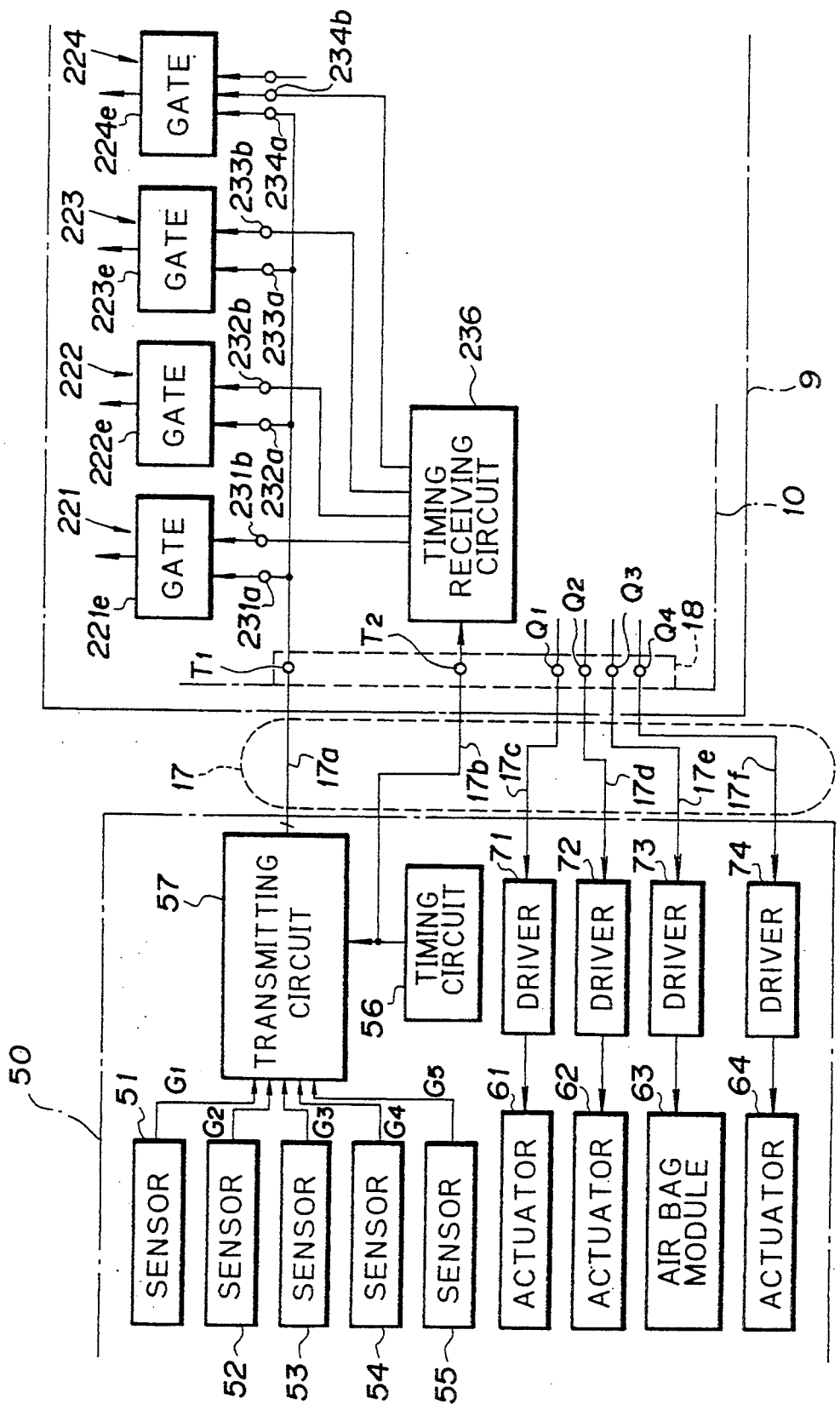
FIG. 11 is a block diagram showing the arrangement of an output portion.

As shown in FIG. 11, the output portion 60 includes a temperature sensor 51 for detecting a temperature of the inside of the the vehicle, a wheel-turn sensor 52 for detecting a turning speed of a wheel, a collision sensor 53 for detecting a collision of the vehicle, an acceleration sensor for detecting the magnitude of the acceleration, a speed sensor for detecting a speed of the vehicle, a timing circuit 56 for outputting a timing signal every predetermined period, and a transmitting circuit 57 for outputting detection signals G1 to G5 output by the sensors 51 to 55 by turns in response to every timing signal output by the timing signal.

Further, the output portion 50 includes an air conditioning actuator (output device), 61, a driver 71 for actuating the air conditioning actuator 61, an antiskid actuator (output device) 82, a driver 72 for actuating the antiskid actuator 62, an air bag module (output device) 63, a driver 73 for carrying electricity to an inflator, not shown, of the air bag module 63, an acceleration actuator (output device) 64, and a driver 74 for actuating the acceleration actuator 64. A signal multiplexing means for multiplexing signals and transmitting or receiving them is composed of the timing circuit 56, the transmitting circuit 57, the timing receiving circuit 236, and the gate circuits 221e to 224e. Also, a transmitting means is composed of the timing circuit 58 and the transmitting circuit 57.

Figure 12:
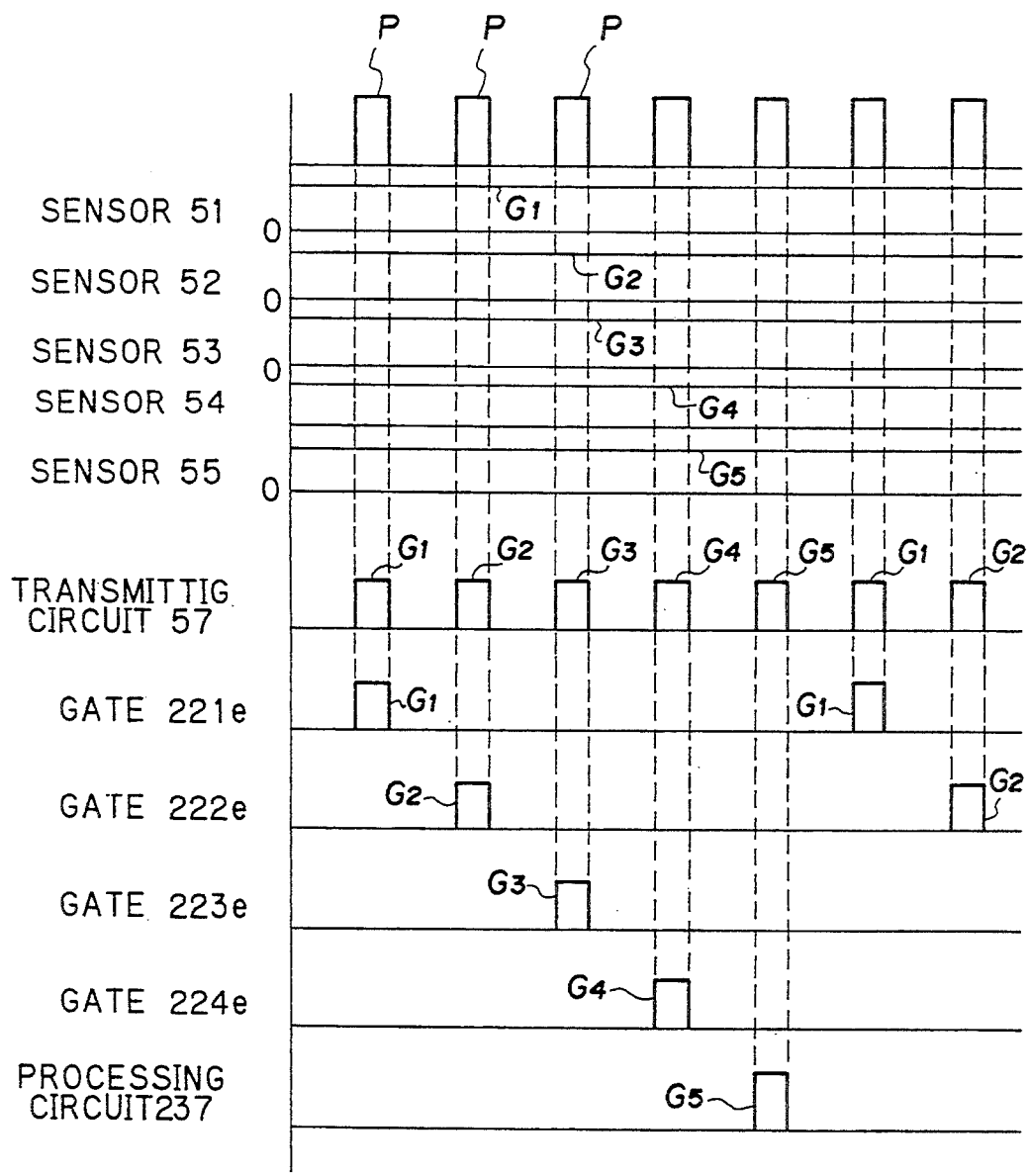
FIG. 12 is a time chart showing detection signals.

The action of the above-mentioned electronic circuits will now be described with reference to a time chart shown in FIG. 12.

Responding to the outputs of the detection signals G1 to G5 from the sensors 51 to 55 and to the periodic outputs of timing signals P from the timing circuit 58, the transmitting circuit 57 outputs the detection signals G1 to G5 by turns every time the timing signal P is output. The detection signals G1 to G5 are input to the input terminal $T_1$ of the connector 18 by means of an input signal line 17a of the harness 17. On the other hand, the timing signals P are input to the timing receiving circuit 236 by means of a signal line 17b of the harness 17 and the input terminal $T_2$.

The timing receiving circuit 236 alternately switches the output terminals 236a-236e every time the timing signals P are input and the circuit 236 outputs the timing signals P from the terminals 236a-236e by turns. Responding to the output of the timing signal P from the output terminal 236a, the gate circuit 221e of the control unit 221 is first opened (the other gate circuits 222e, 223e, and 224e are kept closed) and then the detection signal G1 input to the input terminal $T_1$ is input to the signal processing circuit 221f of the control unit 221. According to the detection signal G1, the air conditioning circuit 221c outputs a control signal S1 for controlling the air conditioning actuator 61.

The control signal S1 is input to the driver 71 through the connecting pin 231c, the output terminal $Q_1$, and the output signal line 17c. According to the control signal S1, the driver 71 actuates the air conditioning actuator 61.

Likewise, responding to the alternate outputs of the timing signals P from the output terminals 236b-236d, the gate circuits 222e, 223e, and the 224e are opened by turns and then the detection signals G2-G4 input to the input terminal $T_1$ are input to the signal processing circuits 222f, 223f, and 224f by turns. According to the detection signals G2, G3, the antiskid control circuit 222c and the air bag control circuit 223c output control signals S2 and S3 for controlling the antiskid actuator 62 and the air bag module 68, respectively.

The control signals S2, S3 are input to the drivers 72, 73 through the connecting pins 232c, 233c, the output terminals $Q_2$, $Q_3$, and the output signal lines 17d, 17e. According to the control signals S2, S3, the drivers 72, 73 actuate the antiskid actuator 62 and the air bag module 63, respectively.

Responding to the output of the timing signal P from the output terminal 236e, the input signal processing circuit 237 processes the detection signal G6 input to the input terminal $T_1$. The processed detection signal G5 is input to the constant speed control circuit 224c. According to the detection signals G4, G5, the constant speed control circuit 224c outputs a control signal S4 for controlling the speed of the vehicle at a constant speed.

The control signal S4 is input to the driver 74 through the connecting pin 234d, the output terminal $Q_4$, and the output signal line 17f. According to the control signal S4, the driver 74 actuates the acceleration actuator 64.

As mentioned above, an arrangement was adopted in which the detection signals G1-G5 are alternately output by the transmitting circuit 57 every time the timing signal P is output and those detection signals G1–G5 alternately input to the input terminal T₁ are input to the signal processing circuits 221f–224f by means of the gate circuits 221e–224e and the timing receiving circuit 236. Therefore, the number of harness 17 can be lessened. As a result, the number of terminals T of the connector 18 can be lessened so that the size of the connector is made smaller than before.

Instead of multiplexing the detection signals to lessen the number of the input signal lines as shown in the above-mentioned embodiment, the control signals S1–S4 may be multiplexed to lessen the number of the output signal lines 17c–17f. Of course, the control and detection signals may be simultaneously multiplexed to lessen the respective numbers of the input and output signal lines.

Figure 13:
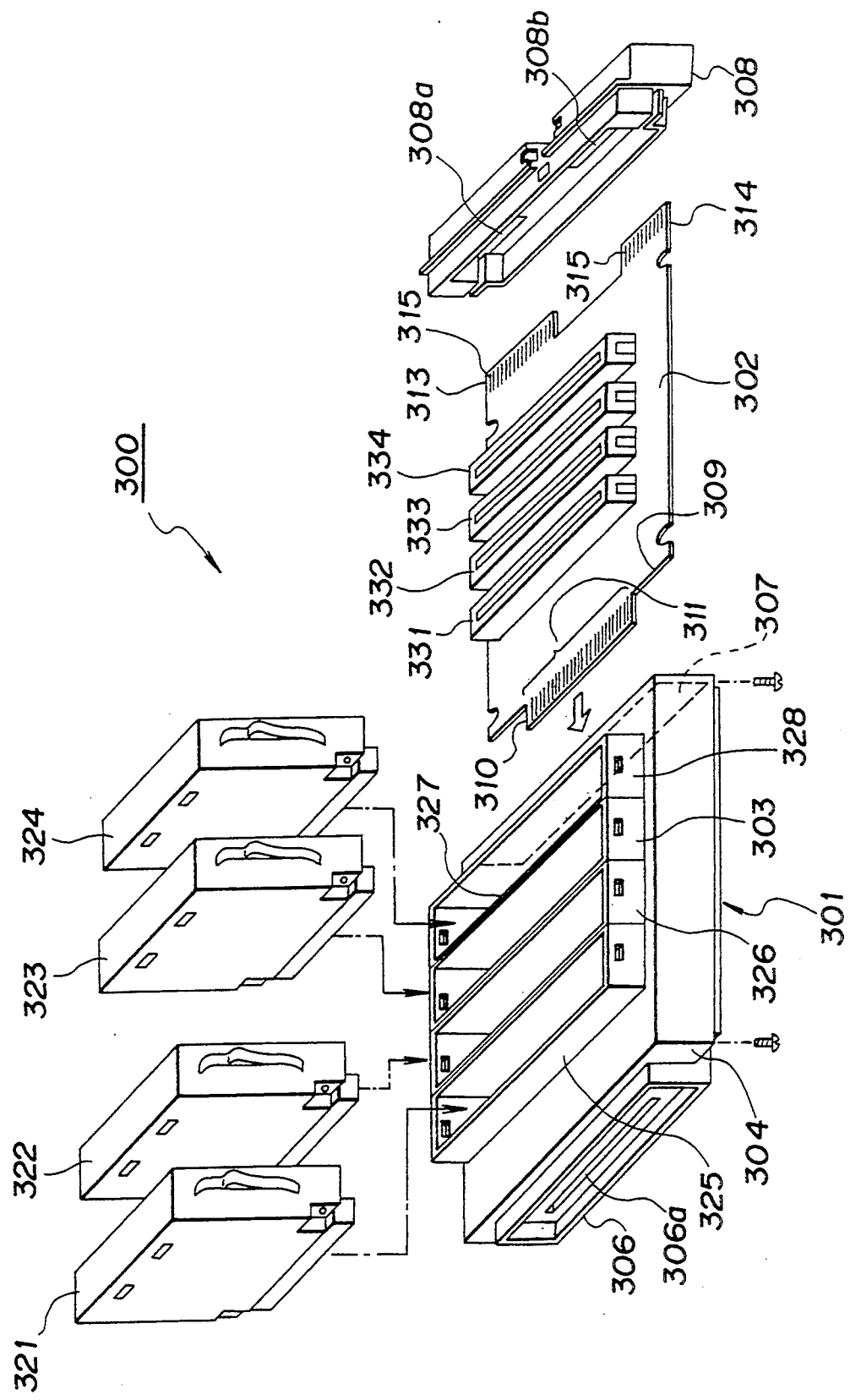
FIG. 13 is an exploded view showing a mother unit of a fourth embodiment of the invention.

FIG. 13 shows a fourth embodiment of the invention.

A mother unit 300 shown in FIG. 13 include a case 801 and a mother board 302 within the case 301. Through the top surface 11a is cut a hole 303 on which holding frames 325–328 for holding control units 321–324, respectively, are fixed. Through the side surface 304 of the front (left side in FIG. 13) of the case 301 is cut a hole 805 (see FIG. 14) on which a protective frame (flange) 306 for protecting a card-edge connector is fixed.

The protective frame 306 and the case 301 are assembled together as different parts in this embodiment. Instead, both of them may be integrated as a solid part. Further, the holding frames 325–328 and the case 301 may be integrated.

A slit 306a is made in the protective frame 306. Through the side surface of the back (right side in FIG. 13) of the case 301 is cut a hole 307 (hole for inserting the mother board 302) on which a connector protective frame (flange) 308 is fixed. Slits 308a and 308b are made in the protective frame 308. The protective frames 306 and 308 have holes for a connector, respectively.

Figure 14:
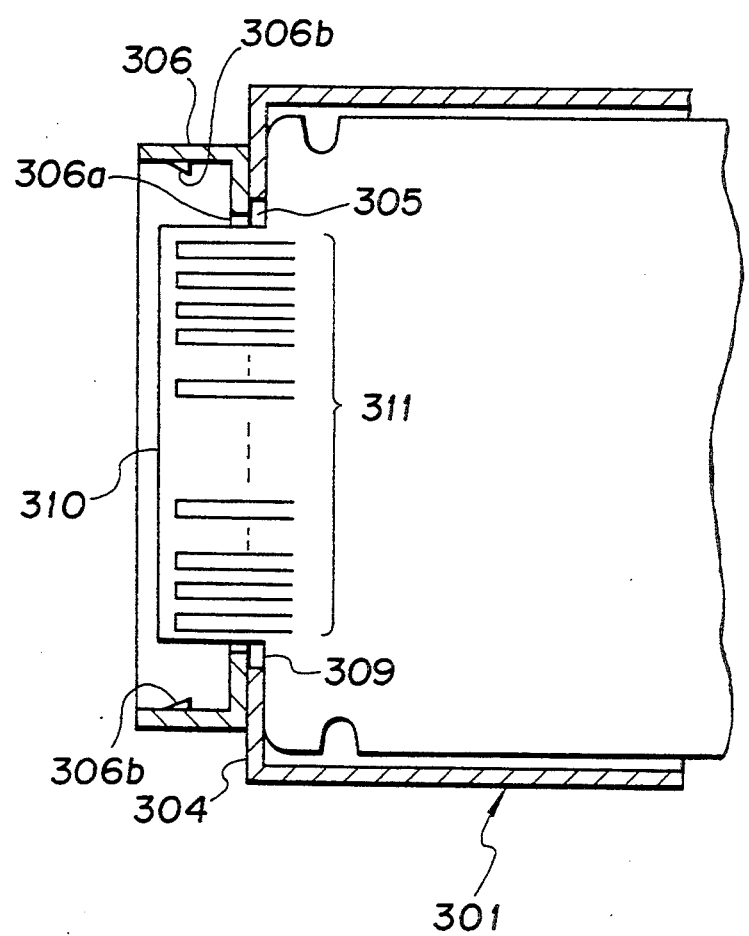
FIG. 14 is an enlarged view of a part of FIG. 13.
Figure 14A:
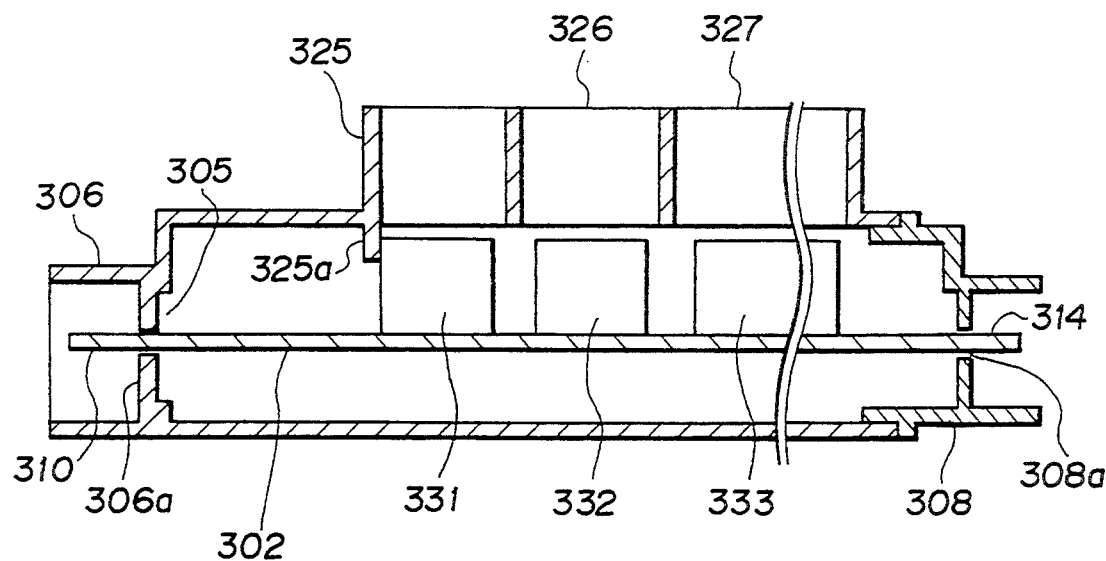
FIG. 14A is a sectional view of a protective frame, a holding frame, and a case each integrated into a unity.
Figure 14B:
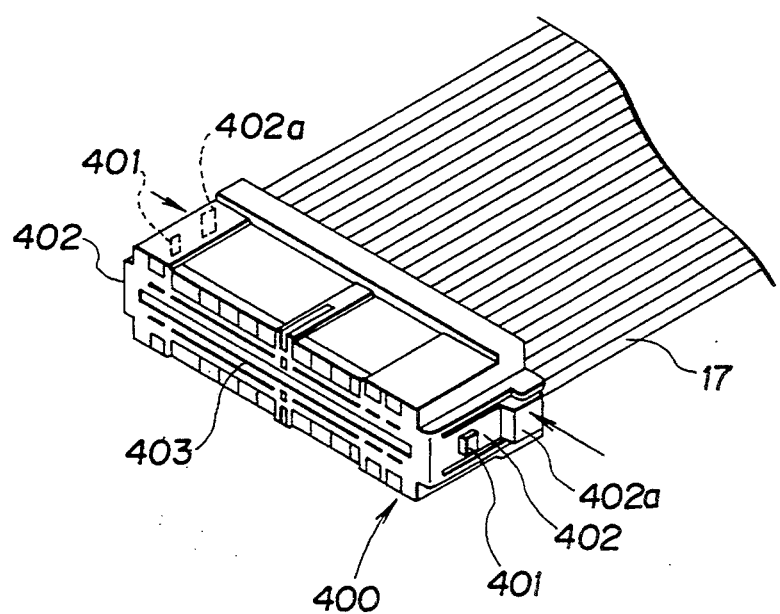
FIG. 14B is a perspective view showing a card-edge connector.

On the inside surface of the protective frame 306 are formed juts 306b, 306b which are engaged with juts 401, 401 of the card-edge connector 400 shown in FIG. 14B. When the card-edge connector 400 is inserted into the protective frame 306, the juts 401, 401, which are formed on elastic plates 402, 402, are engaged with the juts 306b, 306b, respectively. This engagement prevents the card-edge connector 400 from being unexpectedly disconnected from the protective frame 306 because of any vibration or the like.

To release the engagement, the edge portions 402a, 402a of the elastic plates 402, 402 are pressed in the direction of the arrow.

The protective frame 308 and a card-edge connector, not shown, to be inserted thereinto are constructed as the frame 306 and the connector 400.

Numeral 402 designates a connecting slit into which convey portion 310, 313, and 314 are inserted.

The convex portion 310, on which a circuit pattern 311 as a terminal is provided, is formed at the front edge 309 of the mother board 302. The convex portions 313, 314, on each of which a circuit pattern 315 as a terminal is provided, are formed at the back edge 312 of the mother board 302. On the mother board 302 are fixed card-edge connectors 331–334 opposite to the holding frames 325–328, respectively. The card-edge connectors 331–334 are connected with the control units 321–324, respectively.

To assemble the mother unit 300 from the respective parts, the mother board 302 is first inserted into the hole 307 of the case 301 and then the convex portion 310 is inserted into the slit 306a of the protective frame 306 so that the front edge 309 of the mother board 302 is brought into contact with the side wall 304 as shown in FIG. 14. By the contact of the front edge 309 with the side wall 304, the mother board 302 is positioned. After that, the convex portions 313, 314 of the mother board 302 are inserted into the slits 308a, 308b of the protective frame 308, respectively, to fit the protective frame 308 in the hole 307 of the case 301.

As mentioned above, it is easily carried out to assemble the case 301, the mother board 302, and the protective frame 308 into the mother unit 300.

Further, since the mother board 302 is positioned by the side wall 304, the control units 321–324 are correctly connected with the card-edge connectors 331–334 by inserting the control units 321–324 into the holding frames 325–328, respectively.

Figure 15:
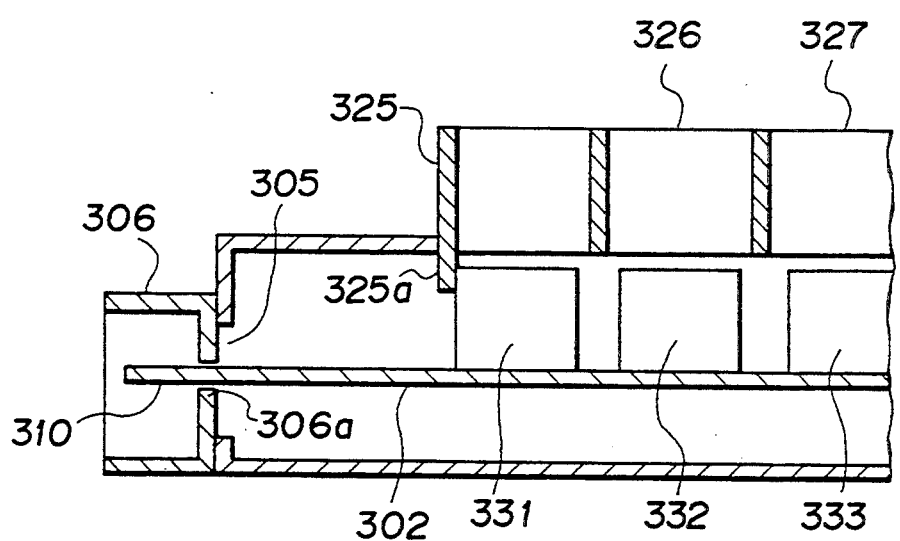
FIG. 15 is a descriptive drawing showing another embodiment.

The front edge 309 is brought into contact with the side wall 304 to position the mother board 302 in this embodiment. Instead, the mother portion 302 may be positioned by bringing a protruding portion 325a of the holding frame 325 into contact with the card-edge connector 331 as shown in FIG. 15.

Figure 16:
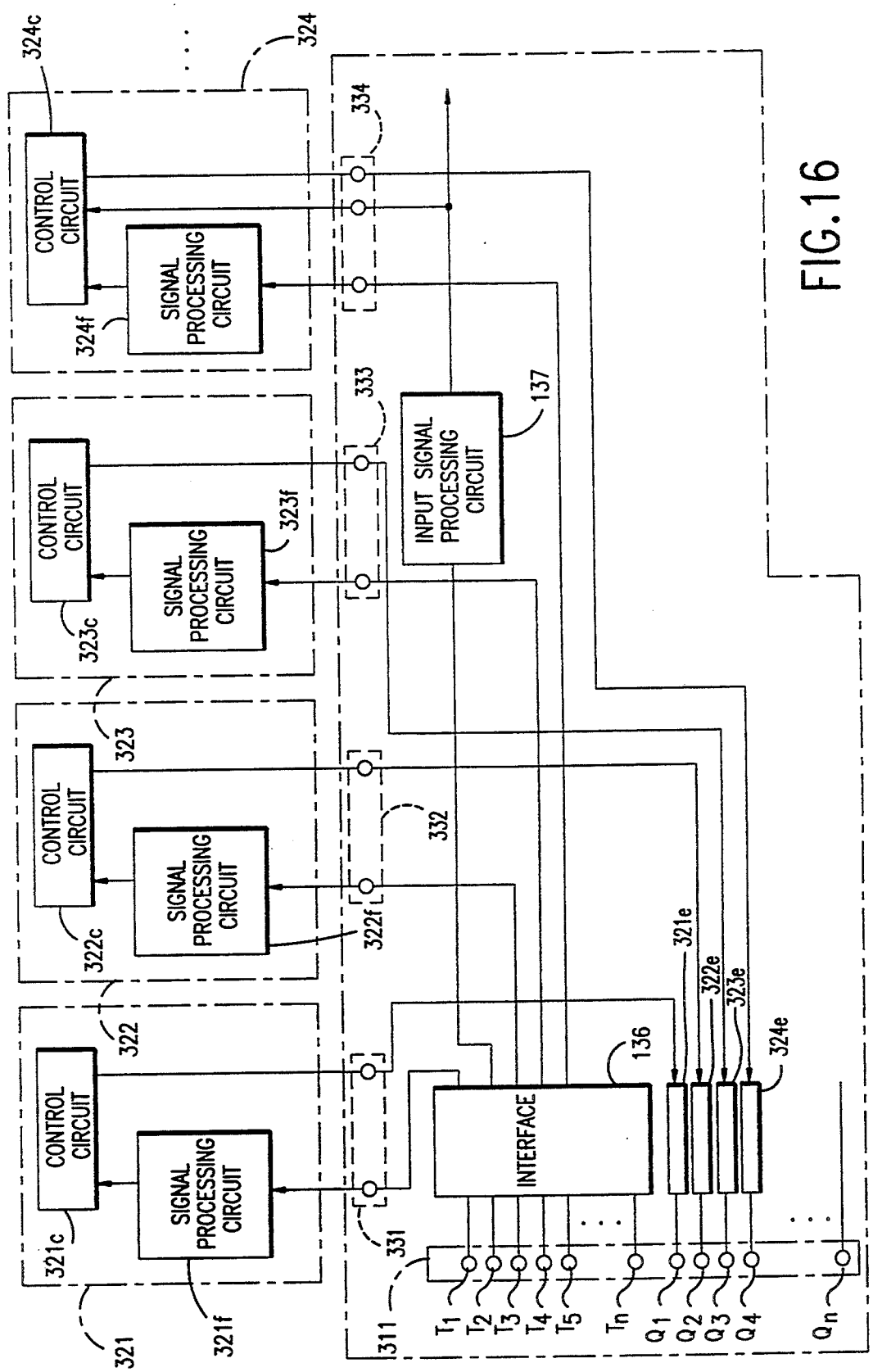
FIG. 16 is a block diagram showing a control system of the fourth embodiment.

FIG. 16 shows circuits of the control units 321–324 and the mother board 302. An interface 136 as an input circuit and drivers 321e–324e each as an output circuit are separately provided on the mother board 302. That is, the interface 136 is provided at the upper side (in FIG. 16) of the front edge, whereas the drivers 321e–324e are provided at the lower side of the same edge of the mother board 302.

The control unit 321 includes, e.g., an air conditioning control circuit 321c including a CPU for controlling the air conditioning of the inside of the vehicle, and a signal processing circuit 321f for processing signals output by a temperature sensor, not shown. The air conditioning control circuit 321c further includes a clock circuit, not shown, a memory, and so forth.

The control unit 322 includes, e.g., an antiskid control circuit 322c including a CPU for stopping a skid of a wheel, and a signal processing circuit 322f for processing signals output by a wheel-turn sensor, not shown. The antiskid control circuit 322c further includes a clock circuit, not shown, a memory, and so forth.

The control unit 323 includes, e.g., an air bag control circuit 323c including a CPU for inflating an air bag, and a signal processing circuit 323f for processing signals output by a collision sensor, not shown. The air bag control circuit 323c further includes a clock circuit, not shown, a memory, and so forth.

The control unit 324 includes, e.g., a constant speed control circuit 324c including a CPU for controlling the speed of the vehicle at a desired speed, and a signal processing circuit 324f for processing signals output by an acceleration sensor, not shown. The constant speed control circuit 324c further includes a clock circuit, not shown, a memory and so forth The mother board 302 is provided with a driver (output circuit) 321e for driving an air conditioning motor, not shown, a relay driver (output circuit) 322e for driving an antiskid actuator, not shown, a driver (output circuit) 323e for carrying electricity to an inflator, not shown, of an air bag module (output circuit), not shown, a driver (output circuit) 324e for driving a solenoid for acceleration, and so forth.

The circuit patterns 315, 315 provided on the convex portions 313, 314 of the mother board 302 are used for control units other than the control units 321-324 shown in FIG. 16.

Figure 17:
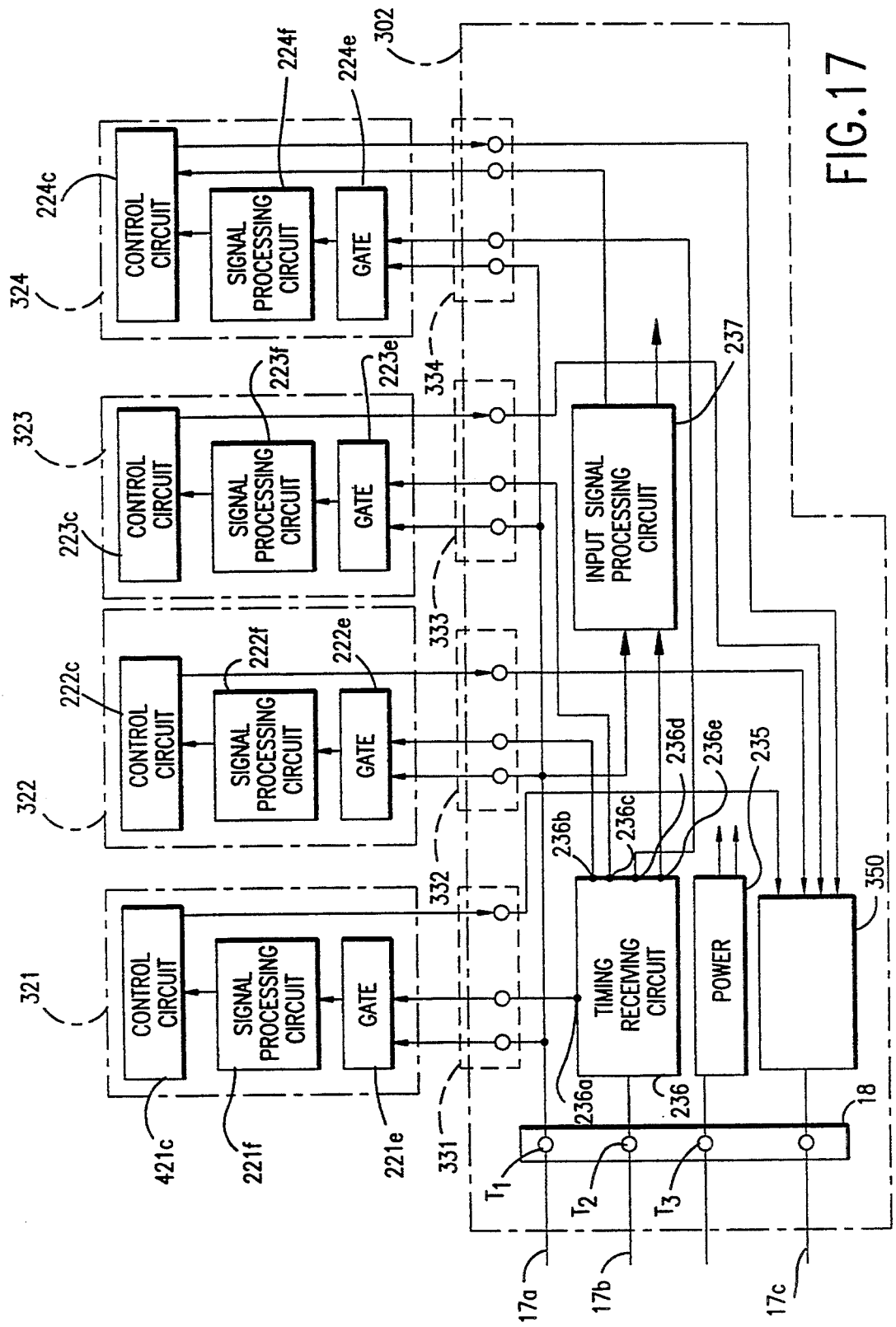
FIG. 17 is a block diagram showing a control system of the fifth embodiment.

FIG. 17 shows a fifth embodiment of the invention. In this embodiment, a driver (output circuit) 350 by which actuators are driven is provided on the front edge portion of the mother board 302. Further, the control unit 321 includes a control circuit 421c for locking or unlocking a door. According to a signal output by a door lock switch, the control circuit 421c outputs a lock signal.

Figure 18:
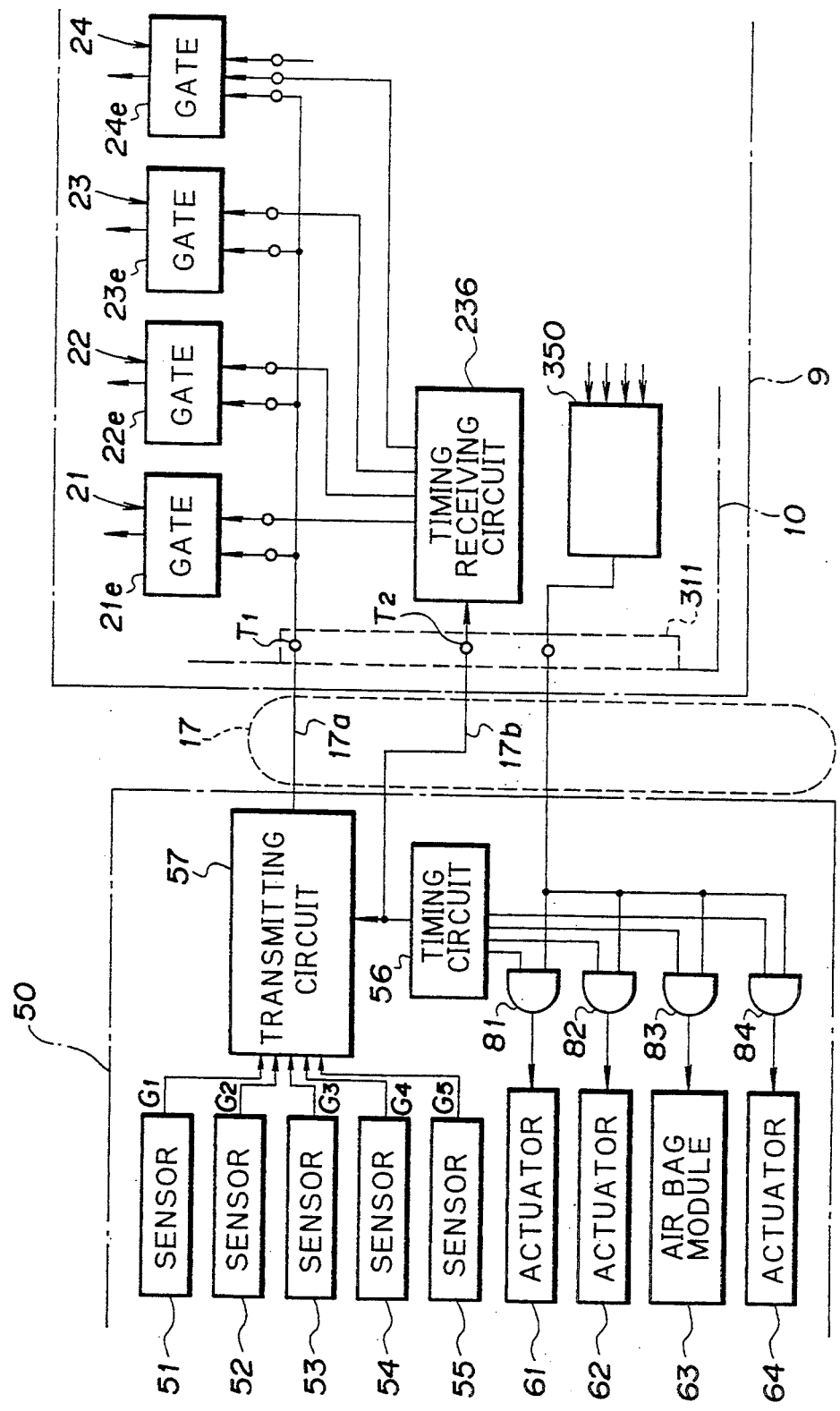
FIG. 18 is a block diagram showing the arrangement of an output portion of the fifth embodiment.
Figure 19:
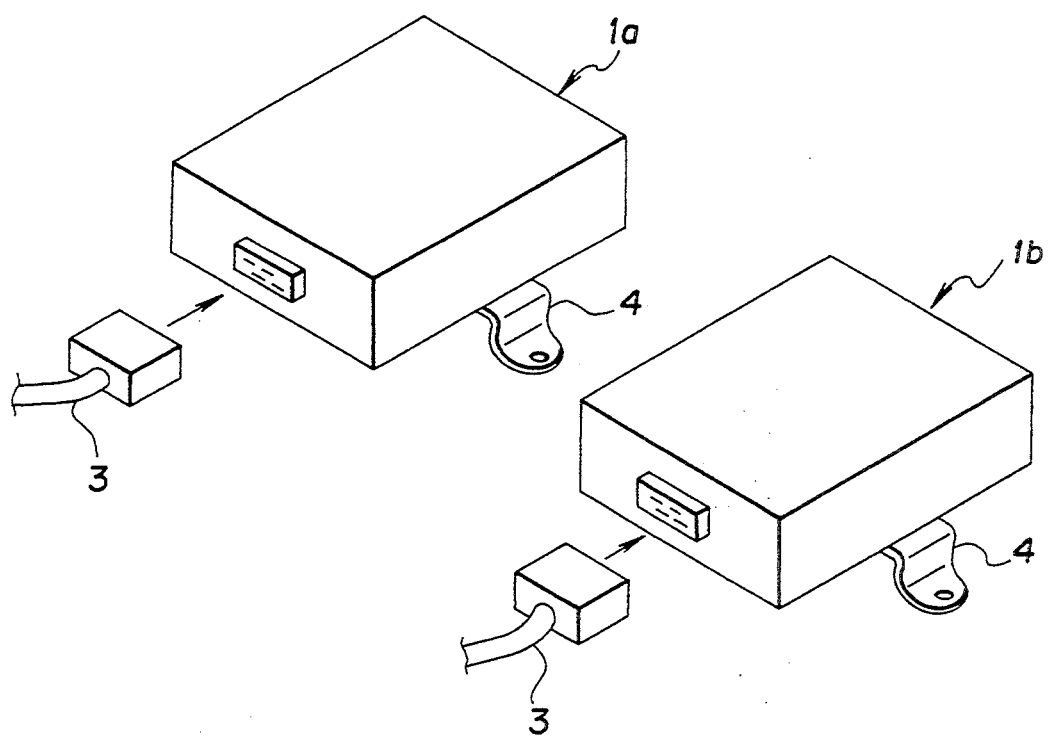
FIG. 19 is a perspective view showing the installation of conventional control units.

As shown in FIG. 18, the electricity output by the driver 350 is carried to actuators 61-64 through AND circuits 81-84, respectively. The AND circuits 81-84 alternately receive timing signals P output by a timing circuit 56. The control circuits 421c, 222c-224c, output respective control signals according to the timing signals P. The actuator 61 shown in FIG. 18 serves to lock a door. Other components in the fifth embodiment are the same as in the third embodiment.

What is claimed is:

1. A vehicle control unit structure, comprising:
   a plurality of control units for controlling output devices provided in a vehicle;
   a case structure defining a plurality of control unit holes formed through a first surface of said case structure, each of said holes corresponding to one of said control units, said case structure also defining an insertion hole formed through a side surface perpendicular to said first surface;
   a mother board having a plurality of connectors disposed in corresponding relationship to said control unit holes and adapted for insertion into said insertion hole of said case structure, said control units each being freely connectable to said connectors through said control unit holes;
   a contact portion, formed on said case structure and disposed on a side surface opposite to said insertion hole, for positioning said mother board by contacting a front end of said mother board so that said connectors are disposed proximate to said control unit holes; and
   a lid for substantially covering said insertion hole to fix said mother board within said case.

2. A vehicle control unit structure according to claim 1, wherein the front end of said mother board is divided into a first portion and a second portion, the first portion being electrically connected with an input circuit and the second portion being electrically connected with an output circuit.

3. A vehicle control unit structure according to claim 1, further comprising drivers disposed on the front end of said mother board for driving said output devices.

4. A vehicle control unit structure, comprising:
   a plurality of control units for controlling output devices provided in a vehicle;
   a case structure defining a plurality of control unit holes formed through a first surface of said case structure, each of said holes corresponding to one of said control units, said case structure also defining an insertion hole formed through a side surface perpendicular to said first surface of said case;
   a mother board having a plurality of connectors disposed in corresponding relationship to said control unit holes and adapted for insertion into said insertion hole of said case structure, said control units being freely connectable to said connectors through said control unit holes;
   a contact portion, formed on said case structure and disposed on said surface having said plurality of holes of said case, for positioning said mother board by contacting one of said connectors so that said connectors are disposed proximate to said control unit holes; and
   a lid for substantially covering said insertion hole to fix said mother board within said case.

5. A vehicle control unit structure according to claim 4, wherein the front end of said mother board is divided into a first portion and a second portion, the first portion being electrically connected with an input circuit and the second portion being electrically connected with an output circuit.

6. A vehicle control unit structure according to claim 4, further comprising drivers disposed on the front end of said mother board for driving said output devices.

7. A vehicle control unit structure, comprising:
   a plurality of control units for controlling output devices provided in a vehicle;
   a case structure defining a plurality of control unit holes formed through a first surface of said case structure, each of said holes corresponding to one of said control units, said case structure also defining an insertion hole formed through a first side surface perpendicular to said first surface of said case, said case structure further defining a slit formed through a second side surface opposite to said first side surface;
   a mother board having a plurality of connectors disposed in corresponding relationship to said control unit holes and adapted for insertion into said insertion hole of said case structure, said control units being freely connectable to said connectors through said control unit holes;
   a connection terminal formed at a front end of said mother board adapted for connection with a card-edge connector, said mother board being adapted for insertion into said insertion hole of said case so that the front end of said mother board is inserted into said slit and juts out of said slit; and
   a lid for substantially converting said insertion hole to fix said mother board within said case.

8. A vehicle control unit structure according to claim 7, further comprising a contact portion formed on said case structure and disposed on said first surface for positioning said mother board by contacting the front end of said mother board so that said connectors are disposed proximate to said control units holes.

9. A vehicle control unit structure according to claim 7, further comprising a flange for protecting a portion of the front end of said mother board that juts out of said slit.

10. A vehicle control unit structure according to claim 9, wherein said flange comprises an engagement portion adapted for engagement with a corresponding portion of the card edge connector.

11. A vehicle control unit structure according to claim 10, further comprising drivers disposed on the front end of said mother board for driving said output devices.

12. A vehicle control unit structure according to claim 7, wherein the front end of said mother board is divided into a first portion and a second portion, the first portion being electrically connected with an input circuit and the second portion being electrically connected with an output circuit.

13. A vehicle control unit structure according to claim 7, further comprising drivers disposed on the front end of said mother board for driving said output devices.

14. A vehicle control unit structure, comprising:
a plurality of control units for controlling output devices provided in a vehicle;
a case structure defining a plurality of control unit holes formed through a first surface of said case structure, each of said control unit holes corresponding to one of said control units, said case structure also defining first and second holes formed through second and third surfaces, respectively, said second and third surfaces being opposite to each other and perpendicular to said first surface;
a mother board having a plurality of connectors disposed in corresponding relationship to said control unit holes and adapted for insertion into said insertion hole of said case structure, said control units being freely connectable to said connectors through said control unit holes, said mother board including first and second connection terminals disposed at a front end portion and a rear end portion, respectively, of said mother board;
a first lid structure defining a first slit for substantially covering said first hole, said mother board being adapted for insertion into said second hole so that the front end portion of said mother board is insertable into and extends out of said first slit; and
a second lid structure defining a second slit, for substantially covering said second hole, the rear end portion of said mother board being adapted for insertion into said second slit and extending out of said second slit to fix said mother board in said case structure when said second lid is closed,
the front and rear end portions of said mother board which extend out of said first and second slits, respectively, being adapted for connection with card-edge connectors.

15. A vehicle control unit structure according to claim 14, further comprising a first and second flange for protecting the front and rear portions of said mother board which extend out of said first and second slits.

16. A vehicle control unit structure according to claim 14, wherein the front end of said mother board is divided into a first portion and a second portion, the first portion being electrically connected with an input circuit and the second portion being electrically connected with an output circuit.

17. A vehicle control unit structure according to claim 14, further comprising drivers disposed on the front end of said mother board for driving said output devices.

18. A vehicle control unit structure, comprising:
a plurality of control units for controlling output devices provided in a vehicle;
a case structure defining a plurality of control unit holes formed through a first surface of said case, each of said control unit holes corresponding to one of said control units, said case structure also defining an insertion hole formed through a second surface perpendicular to said first surface and a first slit formed through a third surface perpendicular to said first surface;
a mother board having a plurality of connectors disposed in corresponding relationship to said control unit holes and adapted for insertion into said insertion hole of said case structure, said control units each being freely connectable to said connectors through said control unit holes, said mother board including a first and a second connection terminals formed at a front end portion and a rear end portion of said mother board, respectively, said mother board being adapted for insertion into said insertion hole so that the front end portion of said mother board is inserted into said first slit and juts out of said first slit; and
a lid structure defining a second slit through which the rear end portion of said mother board extends, for substantially covering said insertion hole, said slit adapted to receive said mother board so that the rear end portion of said mother board extends into said second slit and juts of said second slit when said lid structure is closed,
the front end portion and rear end portion of said mother board, which are jutting out of said first and second slits, respectively, being adapted for connection with card-edge connectors.

19. A vehicle control unit structure according to claim 18, further comprising a first and second flange for protecting the front and rear end portions of said mother board which extend out of said first and second slits.

20. A vehicle control unit structure according to claim 18, wherein the front end of said mother board is divided into a first portion and a second portion, the first portion being electrically connected with an input circuit and the second portion being electrically connected with an output circuit.

* * * * *